United States Patent [19]
Norimatu et al.

[11] Patent Number: 5,361,044
[45] Date of Patent: Nov. 1, 1994

[54] PHASE LOCKED LOOP FREQUENCY SYNTHESIZER

[75] Inventors: Hidehiko Norimatu; Osamu Yamashita, both of Tokyo, Japan

[73] Assignee: NEC Corporation, Tokyo, Japan

[21] Appl. No.: 7,861

[22] Filed: Jan. 22, 1993

[30] Foreign Application Priority Data
Jan. 23, 1992 [JP] Japan .................. 4-032680

[51] Int. Cl.[5] .................. H03L 7/08; H03L 7/18
[52] U.S. Cl. .................. 331/1 A; 331/17; 331/173; 331/25
[58] Field of Search .................. 331/1 A, 16, 18, 25, 331/14, 17, 173, 185

[56] References Cited
U.S. PATENT DOCUMENTS
5,045,813 9/1991 Yamashita et al. .................. 331/16

Primary Examiner—David Mis
Attorney, Agent, or Firm—Sughrue, Mion, Zinn, Macpeak & Seas

[57] ABSTRACT

In a PLL frequency synthesizer capable of minimizing power consumption in the power saving operation, there are disposed a voltage controlled oscillator, a phase detector, an active filter, a reference frequency oscillator, a dual modulus prescaler, and a pulse swallow counter having a modulus control terminal. In the power saving operation, the modulus control terminal is set to an inactive state by a controller to prevent power of a power source from being supplied via the pulse swallow counter to the dual modulus prescaler.

6 Claims, 3 Drawing Sheets

PHASE LOCKED LOOP FREQUENCY SYNTHESIZER

BACKGROUND OF THE INVENTION

The present invention relates to a phase-locked loop (PLL) frequency synthesizer, and in particular, to a PLL frequency synthesizer having a power saving function for minimizing power consumed therein.

DESCRIPTION OF THE RELATED ART

In a PLL frequency synthesizer, a frequency signal produced from a voltage controlled oscillator is divided such that a phase of the resultant signal is compared with that of a reference frequency, thereby generating a voltage having a predetermined phase.

The PLL frequency synthesizer includes a voltage controlled oscillator (VCO), a dual modulus prescaler (DMP), a pulse swallow counter (PSC), a reference frequency oscillator (RFO), a phase detector (PD), and an active filter (AF). The predetermined voltage created from the voltage controlled oscillator is divided by the dual modulus prescaler and the resultant signal is further divided by the pulse swallow counter to be fed to the phase detector. In the detector, the phase of the signal supplied from the pulse swallow counter is compared with that of the reference frequency generated from the reference frequency oscillator so as to supply the active filter with a voltage related to the phase difference thus obtained. In the active filter, the output signal from the phase detector is smoothed to be fed to the voltage controlled oscillator, thereby controlling the output signal therefrom.

In the PLL frequency synthesizer of the prior art, in a period of time in which the frequency signal is not to be generated, a power saving function is effected to reduce the consumption of power. In this situation, to retain conditions externally set to the pulse swallow counter, the voltage from the power source is favorably kept applied thereto. For this purpose, in order to minimize power consumed in the other constituent elements, which are not required to be applied with power in this situation, there are disposed power saving terminals. In short, in the state where the frequency output is not required, switches connected respectively to the power saving terminals are changed over. Resultantly, power from the power supply to the voltage controlled oscillator, the dual modulus prescaler, and the active filter is turned off to thereby minimize the power consumption.

However, it may possibly occur depending on the timing when the power saving function is specified for initiation thereof that the modulus control output from the pulse swallow counter becomes to be an active state during the power saving period. Under the condition, an unnecessary current flows from the pulse swallow counter into the dual modulus prescaler, which consequently leads to the following problem. Namely, even when the power saving is specified to be conducted, the effect thereof cannot be fully achieved.

SUMMARY OF THE INVENTION

It is therefore an object of the present invention to provide a PLL frequency synthesizer capable of minimizing the power consumption during the power saving operation, thereby solving the problem above.

In accordance with the present invention, there is provided a PLL frequency synthesizer comprising voltage controlled oscillator means for producing an output voltage signal having a controlled frequency, dual modulus prescaler means for dividing the output signals from said voltage controlled oscillator means, pulse swallow counter means for dividing the signal inputted from said dual modulus prescaler means according to a division number specified by a signal supplied from a peripheral device, namely, a logic device which is arranged outside of the synthesizer, phase detector means for comparing a phase of an output signal from said pulse swallow counter means and a phase of a reference signal from a reference frequency oscillator and generating an output voltage according to a phase difference therebetween, active filter means for smoothing the output voltage from said phase detector means and supplying the smoothed output voltage to said voltage controlled oscillator means, and control means connected to said pulse swallow counter means and said dual modulus prescaler means for setting in a power saving operation a modulus control terminal of said dual modulus prescaler to an inactive state.

Moreover, in accordance with the present invention, the control means is arranged between a modulus control output terminal of the pulse swallow counter means and a modulus control output terminal of the dual modulus prescaler. The control means includes a switch for conducting a change-over operation, depending on an external control, of the modulus control output between an active state and inactive state.

According to the PLL frequency synthesizer of the present invention, when the modulus control terminal of the dual modulus prescaler is set to inactive state by the control means, the current from the pulse swallow counter means to the dual modulus prescaler means is prevented during the power saving operation, thereby reducing the power consumed therein.

BRIEF DESCRIPTION OF THE DRAWINGS

The objects and features of the present invention will become more apparent from the consideration of the following detailed description taken in conjunction with the accompanying drawings in which:

FIG. 8 is a block diagram showing a control circuit and a pulse swallow counter in an alternative embodiment according to the present invention.

DESCRIPTION OF THE PREFERRED EMBODIMENTS

Figure 1:
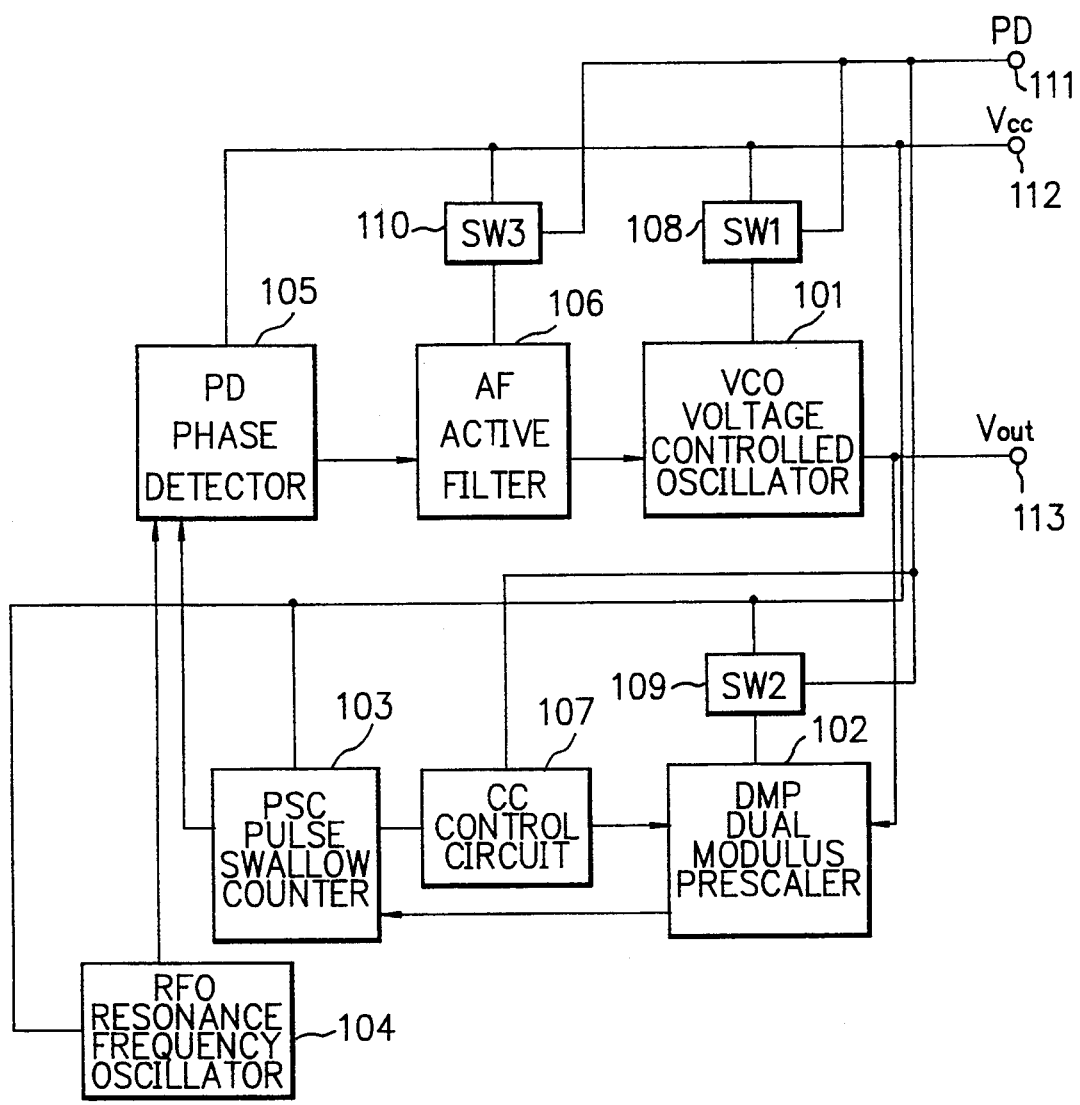
FIG. 1 is a schematic block diagram showing the configuration of a PLL frequency synthesizer in an embodiment in accordance with the present invention.

Referring now to the drawings, description will be given of an embodiment of a PLL frequency synthesizer in accordance with the present invention. FIG. 1 shows an embodiment of the synthesizer according to the present invention.

As shown in this diagram, the synthesizer includes a voltage controlled oscillator (VOC) 101, a dual modulus prescaler (DMP) 102, a pulse swallow counter (PSC) 103, a reference frequency oscillator (RFO) 104, a phase detector (PD) 105, and an active filter (AF) 106.

The voltage controlled oscillator 101 generates an output voltage signal 113 having a controlled frequency to be delivered to the dual modulus prescaler 102. In the prescaler 102, the received signal 113 is divided to be fed to the pulse swallow counter 103. In the counter 103, the signal 114 inputted from the prescaler 102 is again divided according to a frequency specified by a signal supplied from devices such as logic device which is not shown in Figures, arranged outside of the synthesizer.

The phase detector 105 receives a signal delivered from the pulse swallow counter 103 and a reference frequency signal from the reference frequency oscillator 104 to compare a phase of the signal with that of the reference frequency signal to produce a voltage depending on a phase difference therebetween. The active filter 106 smoothes the outputted voltage from the phase detector 105 to send the resultant signal as control voltage to the voltage controlled oscillator 101.

The constituent components above are supplied with power from a power source Vcc. There are disposed switches 108, 109, and 110 between the power source Vcc and the oscillator 101, the prescaler 102, and the filter 106, respectively. These switches 108 to 110 are connected to a power down switch 111 so as to be changed over in response to a power down signal supplied therefrom. Thanks to the switches 108 to 110, the power from the power supply Vcc to these elements 101, 102, and 106 is turned off during the period in which the output frequency is not required, thereby reducing the power consumption.

In the PLL frequency synthesizer according to the present invention, a control circuit (CC) 107 is arranged between a modulus control output terminal of the counter 103 and a modulus control input terminal of the prescaler 102. The control circuit 107 is connected to the power down terminal. In response to a power down signal received therefrom during the power saving operation, this circuit 107 sets the modulus control input terminal of the prescaler 102 to inactive state.

Figure 2:
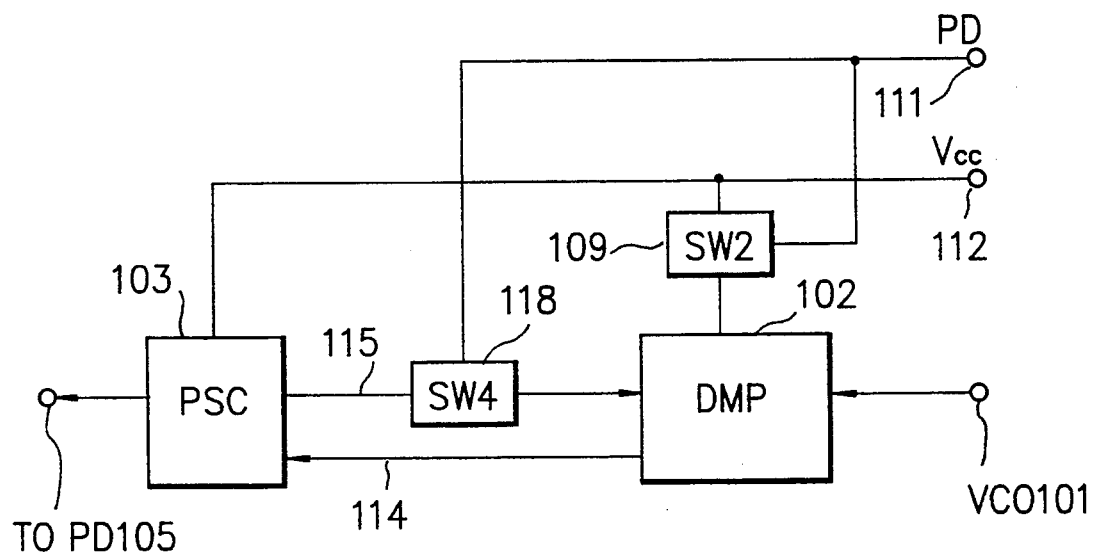
FIG. 2 is a block diagram showing an example of a control circuit of the constitution of FIG. 1.

As shown in FIG. 2, the control circuit 107 includes, for example, a switch 118 disposed between a modulus control output terminal of the counter 103 and a modulus control input terminal of the prescaler 102 for changing over, in response to an external control signal, the modulus control output between active and inactive state.

Subsequently, the operation of the synthesizer will be described. The dual modulus prescaler 102 divides the frequency output signal from the voltage controlled oscillator 101 and then delivers the resultant signal to the pulse swallow counter 103. The counter 103 in turn divides, according to a frequency specified by a signal supplied from an logic device, not shown the signal received from the prescaler 102 to send the obtained signal to the phase detector 105. The detector 105 compares a phase of the signal inputted from the counter 103 with that of the reference signal from the reference frequency oscillator 104 to output a voltage associated with a phase difference therebetween to the active filter 106. The filter 106 smoothes the received voltage signal and then feeds the resultant signal, as control voltage to the voltage controlled oscillator 101, thereby controlling the frequency of the signal outputted therefrom.

In the period when the frequency output is not required in the PLL frequency synthesizer, the switches 108 to 110 are operated to prevent the power source 111 from supplying power to the oscillator 101, the prescaler 102, and the filter 106 such that the modulus control line 115 is set to inactive state by the control circuit 107. As a result, the current flowing from the counter 103 into the prescaler 102 is interrupted during the power saving operation, thereby minimizing the quantity of power consumed by the system.

In other words, as can be seen from FIG. 2, the switch 118 between the modulus control output terminal of the counter 103 and the modulus control input terminal of the prescaler 102 is turned off to set the modulus control terminal to the inactive state.

Figure 3:
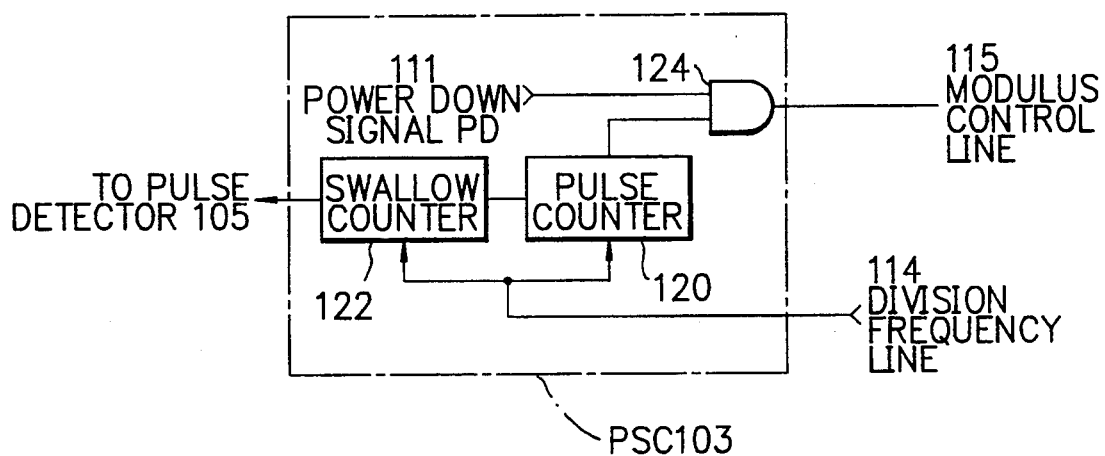

FIG. 3 shows the control circuit 107 and the pulse swallow counter 103 in an alternative embodiment according to the present invention. In this embodiment, the pulse swallow counter 103 includes a pulse counter 120 and a swallow counter 122. Moreover, the control circuit includes an AND circuit 124 and is disposed in the pulse swallow counter 103. The signal obtained by division achieved in the dual modulus prescaler 102 is supplied therefrom to the pulse counter 120 and the swallow counter 122. The counter 122 in turn sends an output signal to the phase detector 105. Supplied to one of the input terminals of the AND circuit 124 is the power down signal from the power down terminal 111. Another input terminal of the AND circuit 124 is supplied with an output signal from the pulse counter 120. The AND circuit 124 resultantly delivers an output signal to the dual modulus prescaler 102.

In consequence, when the power down signal PD is active, such as high level, the AND circuit 124 having received the high-level signal via the power down terminal 111 delivers therefrom the signal received from the pulse counter 120, thereby achieving an operation of an ordinary pulse counter. However, when the signal PD is inactive such as at a low level, the AND circuit receives the low-level signal from the terminal 111 and hence does not send the output signal via the signal line 115 to the dual modulus prescaler 102. As a result, the current from the counter 103 to the prescaler 102 is prevented.

In this regard, the AND circuit 124 may be disposed in the pulse swallow counter 103 or may be arranged in the form of the control circuit 107.

Figure 4:
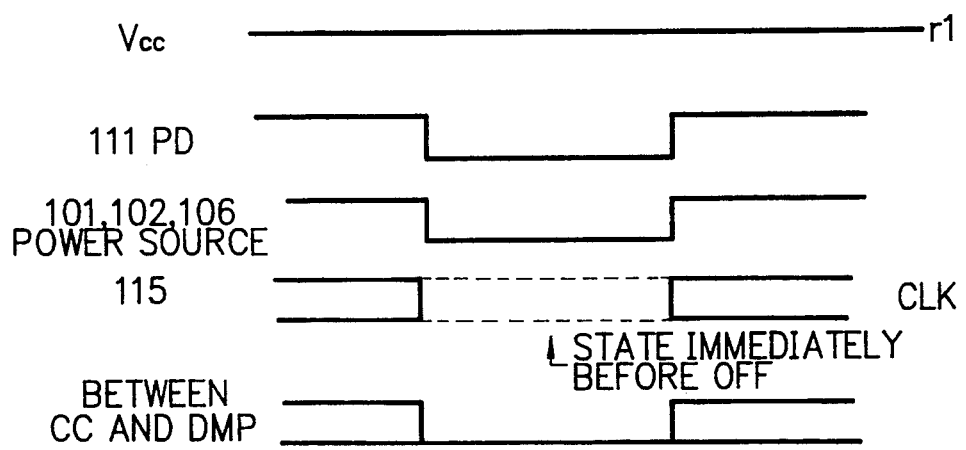
FIG. 4 is a signal timing chart for explaining the power saving operation of the PLL frequency synthesizer of FIG. 1.

FIG. 4 is a signal timing chart useful to explain the power saving operation of the PLL frequency synthesizer. As shown in this chart, power from the power source Vcc is kept supplied to the system even when the power down operation is in process. When the power down signal PD is set to a low level or inactive state in response to a power down operation, the power to the oscillator 101, the prescaler 102, and the filter 106 is interrupted. Although the clock signal CLK is kept delivered to the control circuit from the counter 103 via the signal line 115, the clock signal CLK from the control circuit 107 to the prescaler 102 is not supplied.

As described above, in the PLL frequency synthesizer according to the present invention, a control circuit is arranged between the modulus control output terminal of the pulse swallow counter and the modulus control input terminal of the dual modulus prescaler to set, in response to an external signal, the modulus control line to inactive such as, thereby minimizing the power consumed during the power saving operation.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is

1. A phase-locked loop frequency synthesizer comprising:
    voltage-controlled oscillator means for producing an output voltage signal having a controlled frequency in accordance with a control voltage input thereto;
    dual modulus prescaler means, electrically coupled to said voltage-controlled oscillator means, for receiving and dividing the output voltage signal from said voltage-controlled oscillator means to produce a divided signal;
    pulse swallow counter means, electrically coupled to said dual modulus prescaler means, for receiving and dividing the divided signal provided by said dual modulus prescaler means according to a division number specified by a supplied signal to produce a second divided output signal;
    phase detector means, electrically coupled to said pulse swallow counter means, for comparing a phase of the second divided output signal provided by said pulse swallow counter means with a phase of a reference signal provided by a reference frequency oscillator and generating a voltage signal according to a phase difference therebetween;
    active filter means, electrically coupled to said phase detector means, for receiving and smoothing the voltage signal provided by said phase detector means and supplying the smoothed voltage signal as said control voltage to said voltage controlled oscillator means; and
    power-saving control means, electrically coupled to said pulse swallow counter means and said dual modulus prescaler means, for setting, during a power saving operation, a modulus control input terminal of said dual modulus prescaler means to an inactive state by electrically disconnecting said pulse swallow counter means from said dual modulus prescaler means.

2. A phase-locked loop frequency synthesizer as claimed in claim 1, wherein said power-saving control means includes a switch electrically coupled to a modulus control output terminal of said pulse swallow counter means and said modulus control input terminal of said dual modulus prescaler means for switching said modulus control input terminal between an active state and said inactive state by electrically connecting and disconnecting, respectively, said pulse swallow counter means from said dual modulus prescaler means.

3. A phase-locked loop frequency synthesizer as claimed in claim 1, wherein said power-saving control means includes an AND circuit having a first input terminal and a second input terminal,
    said first input terminal being electrically connected to a terminal to which a power down signal is supplied in the power saving operation,
    said second input terminal being electrically connected to an output terminal of said pulse swallow counter means.

4. A phase-locked loop frequency synthesizer as claimed in claim 3, wherein said AND circuit is disposed in said pulse swallow counter means.

5. A phase-locked loop frequency synthesizer as claimed in claim 3, wherein said pulse swallow counter means includes a pulse counter and a swallow counter.

6. A phase-locked loop frequency synthesizer as claimed in claim 4, wherein said pulse swallow counter means includes a pulse counter and a swallow counter.

* * * * *